(12) United States Patent
Zommer et al.

(10) Patent No.: US 6,710,405 B2
(45) Date of Patent: Mar. 23, 2004

(54) NON-UNIFORM POWER SEMICONDUCTOR DEVICE

(75) Inventors: Nathan Zommer, Los Altos, CA (US); Vladimir Tsukanov, Mountain View, CA (US)

(73) Assignee: Ixys Corporation, Santa Clara, CA (US)

( * ) Notice: Subject to any disclaimer, the term of this patent is extended or adjusted under 35 U.S.C. 154(b) by 0 days.

(21) Appl. No.: 09/764,545

(22) Filed: Jan. 17, 2001

(65) Prior Publication Data

US 2002/0093033 A1 Jul. 18, 2002

(51) Int. Cl.[7] .............. H01L 29/76; H01L 27/10; H01L 29/94
(52) U.S. Cl. .............. 257/341; 257/202; 257/401
(58) Field of Search .............. 257/341, 202, 257/204, 206, 401

(56) References Cited

U.S. PATENT DOCUMENTS

| | | |
|---|---|---|
| 4,199,774 A | 4/1980 | Plummer |
| 4,532,534 A | 7/1985 | Ford et al. |
| 4,639,762 A | 1/1987 | Neilson et al. |
| 4,860,072 A | 8/1989 | Zommer |
| 4,881,106 A | 11/1989 | Barron |
| 4,959,699 A | 9/1990 | Lidow et al. |
| 5,089,864 A * | 2/1992 | Sakurai .............. 257/341 |
| 5,187,555 A * | 2/1993 | Kuroda et al. .............. 257/202 |
| 5,229,629 A | 7/1993 | Koike |
| 5,237,481 A | 8/1993 | Soo et al. |
| 5,497,014 A | 3/1996 | Momose |
| 5,557,127 A | 9/1996 | Ajit et al. |
| 5,631,484 A * | 5/1997 | Tsoi et al. .............. 257/341 |
| 5,917,207 A | 6/1999 | Colwell et al. |
| 5,973,376 A | 10/1999 | Rostoker et al. |
| 6,002,153 A * | 12/1999 | Tsunoda et al. .............. 257/341 |
| 6,140,184 A * | 10/2000 | Dupuy et al. .............. 257/401 |

* cited by examiner

Primary Examiner—Steven Loke
(74) Attorney, Agent, or Firm—Townsend and Townsend and Crew LLP

(57) ABSTRACT

An active area of a power device comprises active cells having designs that vary depending on where they are located in the active area. Design variations include structural variations and variations in the material used to produce the cells.

36 Claims, 5 Drawing Sheets

NON-UNIFORM POWER SEMICONDUCTOR DEVICE

BACKGROUND OF THE INVENTION

The present invention relates to semiconductor devices, and more specifically to semiconductor devices having repeated cell structures. In particular the invention is directed to semiconductor power devices which comprise one or more arrays of active cells (transistors), but is applicable in devices such as semiconductor memories which comprise one or more arrays of repeated active cells, namely, memory cells.

Semiconductor power devices (e.g., metal oxide semiconductor field effect transistors, MOSFETs) are designed and manufactured with a repetitive structure. The repeated structure comprises patterns of one or more repetitive cell (transistor) structures and ancillary elements. FIG. 6A shows a semiconductor die 601 of a conventional semiconductor power device and its constituent structures. A main active area 602 of the device die comprises a repetition of one type of transistor, sometimes referred to as a cell or a main cell of the device. This is designated in the figure by the letter A (the "A cells").

The active area is the main area of the power device, typically located within a region bounded by an edge termination area. The edge termination area usually does not contain active transistors, what are commonly referred to as active devices. In the industry, passive devices, the opposite of active devices, include resistors, capacitors and inductors. The edge of the power device is composed of guard rings, or field shielding plates, that serve to provide the device with a high breakdown capability. Since this section is on the periphery and includes mainly floating junctions or field plates, which are different from the main transistor of the power device, this section is not called the active area. The area that is contained by the edge section, and has the main active cells of the device, that define and control its operational function is the active area. In a power device, such as one described and claimed in this specification, there is a parallel combination of a multitude of active device cells, with the same overall physics of device operation. The multitude of active device cells are operatively and turned on in parallel with the same control signal, constitute the operation of the main device. This region is the active region for the purpose of this application.

As noted above, a guard ring region 604 constitutes a non-active area which includes the very edges of the device die, and is sometimes referred to as the die termination area. The guard ring region does not contain active transistor cells, such as those contained within the area bounded by the guard ring region.

A peripheral section of the active area 602 of the semiconductor power device adjacent the guard ring region comprises another type of repetitive cell structure identified in the figure by the letter B (the "B cells"). These cells are commonly referred to as termination structures or end structures. They serve to seal off the edges of the active area 602 to provide for reliable device operation by preventing spurious edge effects due to high voltage differentials between the boundary of the active area and the edge of the device. In most cases, the peripheral section does not contain A cells.

The interior of the active area 602 further includes a region 608 which surrounds a gate bond pad 611 and regions 606 which surround gate finger segments 612L, 612R, 612C, and 612T. The cells which populate regions 606 and 608 are identified by the letter C (the "C cells"). The C cells are edge cells like the B cells in their role in a semiconductor power device. Since the left and/or right sides of the semiconductor chip might be different than the bottom or the top sides of the chip, in a general case, cells B and cells C might be different in structure. Further, it is standard die layout practice that the B and C cells might be varied in dimension and structure in order for them to fit geometrically and physically in their designated areas. For purposes of discussion, to distinguish the A cells which are the workhorses of the power device and the B and C cells, the A cells are referred to as the active cells, while the B and C cells are collectively referred to as the peripheral cells.

The B and C cells are the cells that interface or buffer the active area from the effects of the edge termination area. The edge termination area, usually has a higher electric field in the OFF state. Consequently, upon switching the device from the OFF state to the ON state and vice versa, transient voltage effects like dV/dt can generate extra holes and electrons in the semiconductor material near the edge of the chip, which will be flowing to the active area via the periphery cells B and C. Therefore, these cells should have a good short path to 'ground' potential in a typical n-channel power MOSFET, IGBT, or a thyristor of which the top surface, source, emitter or cathode is connected to ground. In other words the B and C cells are not active device cells like the more internal active cells, like A's in FIG. 6A. In a typical device, such as MOSFET or IGBT, these peripheral cells will not have any $n^+$ source or emitter areas, comprising just the corresponding $p^+/p^-$ well or base region with a relatively large contact area to the top source or emitter metal that is usually connected to the lowest potential, ground in most cases. These cells might contain edge sections of the poly-silicon gate, for MOS type power transistors, for the purpose of connectivity only. Thus, a gate metal line is disposed about the periphery and is contacted to the poly-silicon gate area in these periphery cells too. This gate metal line makes contact to the poly-silicon in these periphery cells, in its part that is removed from the metal and contact area that is connected to the source, emitter or ground potentia area.

Referring to FIG. 6B, another layout example of a conventional power device die 631 is shown. The active area 602 which provides the function of the power device comprises active cells A. The active area is surrounded by B cells, which are known as periphery termination cells. In addition, these types of cells typically are found disposed about the gate bus area, because of similar transient voltage effects in its vicinity, much like the edge termination area.

In some devices, a portion of the active area 602 extends beneath the source (or emitter) bond pads 614 so that the area beneath the bond pads is populated with A cells. Other applications call for the portion of the active area beneath the source (or emitter) bond pads to be populated with modified cells. See for example, U.S. Pat. No. 4,881,106. In some special cases, the application may call for a power device die in which the portion of the active area beneath the bond pad is absent cells of any kind.

Some power device applications incorporate specialized cells in the active area 602 that do not serve as an active cell. For example, temperature sensing cells can be incorporated in the active area to provide an indicator of the device temperature. Other sensors include current sensors. See also, U.S. Pat. Nos. 5,237,481 and 5,063,307. However, special application power devices aside, the active area 602 typically comprises a regular uniform pattern of A cells. A common shape is the hexagon, though square-shaped and triangular-shaped cells are known. Also, cells having a linear (striped) geometry are in use.

Limitations in the performance of conventional power devices arise from the fact that various physical characteristics of such a device during its operation do not manifest themselves uniformly throughout the device. For example, the temperature rise varies depending on the location on the die; e.g., the center of the die typically is the hottest region of the device. The distribution of electric current in the active area 602 varies due in part to the non-uniform temperature distribution, which tends to create a situation known as "current hogging." This in turn leads to further temperature disparity across the die, potentially producing thermal runaway and resulting in device failure. Other physical disparities include transient voltages which vary across the die, variations in the resistance of individual cells, non-uniform distribution of internal capacitances, variations in the electrical charge across the junctions in the cells, variations in the junction leakage currents in the units during turn-off and reverse blocking modes, and so on.

The edges of the device, such as the guard ring region 604 and termination regions 642R and 642L shown in FIG. 6B, are usually cooler relative to the interior since these regions contain no active cells. Consequently, the performance of active A cells proximate these portions is better that the A cells in the interior of the active area 602. This is true also of A cells in the vicinity of other structures found in a power device which contain no active cells, such as scribe lines or streets.

The effects of such non-uniform thermal and electrical dynamic and static performance, lead to an increase in the ON resistance of power MOSFETs. This is the result of a smaller area of the device participating in the conduction of current, as compared to the current conduction that might be realized if the device temperature was more uniformly distributed.

In addition, the tendency of hot spot formation in the active area will lead to failure of the device in a high power switching mode where both a high voltage (less than its breakdown voltage) and the ON current state condition exists. This limits the safe operating area (SOA) of the device. The SOA is a typical data sheet figure of merit for a semiconductor power device. The SOA is temperature sensitive, and as such, non-uniform temperature distributions limit the SOA, both in the ON state and in the transitions from the ON state to the OFF state. Also, a non-uniform temperature distribution changes the resistivity and capacitances in the device's hotter regions to an extent that the device's switching speed is adversely affected. One reason for this effect is due to an increase in the resistance of the gate bus region in the hotter parts of a power MOSFET or IGBT (insulated-gate bipolar transistor) die. This results in an overall slower operation of the power device.

Attempts to address this problem include using thinner dies to improve the thermal behavior. A thinner die promotes cooling. Another technique is to increase the thickness of the top layer metallization. A thicker metallization improves lateral thermal conduction across the surface to even out the temperature non-uniformities. A die coating is sometimes provided on the surface of the die. The die coating has better thermal conduction properties than ambient and conventional polymer encapsulating material. As such, a die coating will absorb and conduct heat from the underlying die hot spots to reduce the operating temperature. Operationally, the power device can be biased with a lower voltage to reduce the overall current density in the die. The transistor gain ($I_{in}/I_{out}$) of each cell can be reduced, or its transconductance ($I_{out}/V_{in}$) can be reduced, and the like. While these approaches tend to reduce the operating temperature and the consequent performance non-uniformities across the die, they do so at the expense of structural integrity of the die, increased manufacturing cost of the device, or by overly conservative operation of the device in a lower power range so that the operating capacity of the device is not fully realized.

There is a need to provide an improved semiconductor power device to overcome the foregoing described thermal and electrical operating limitations present in conventional devices.

SUMMARY OF THE INVENTION

According to the present invention a semiconductor device is provided having an active area comprising active cells. Each cell has an associated cell design that varies depending on where it is located in the active area. Design variations include structural variations and variations in the material composition of the cell. The operating parameter of each cell can vary depending on its location in the active area of the power device.

A device provided in accordance with the present invention exhibits increased surface temperature uniformities during operation. The result is, among other things, increased SOA, increase speed, and improved switching efficiencies. The reliability of the device is improved. In addition, data sheet parameters such as power sensitivity and thermal sensitivity are improved.

BRIEF DESCRIPTION OF THE DRAWINGS

The teachings of the present invention can be readily understood by considering the following detailed description in conjunction with the accompanying drawings.

DESCRIPTION OF THE SPECIFIC EMBODIMENTS

Figure 6A:
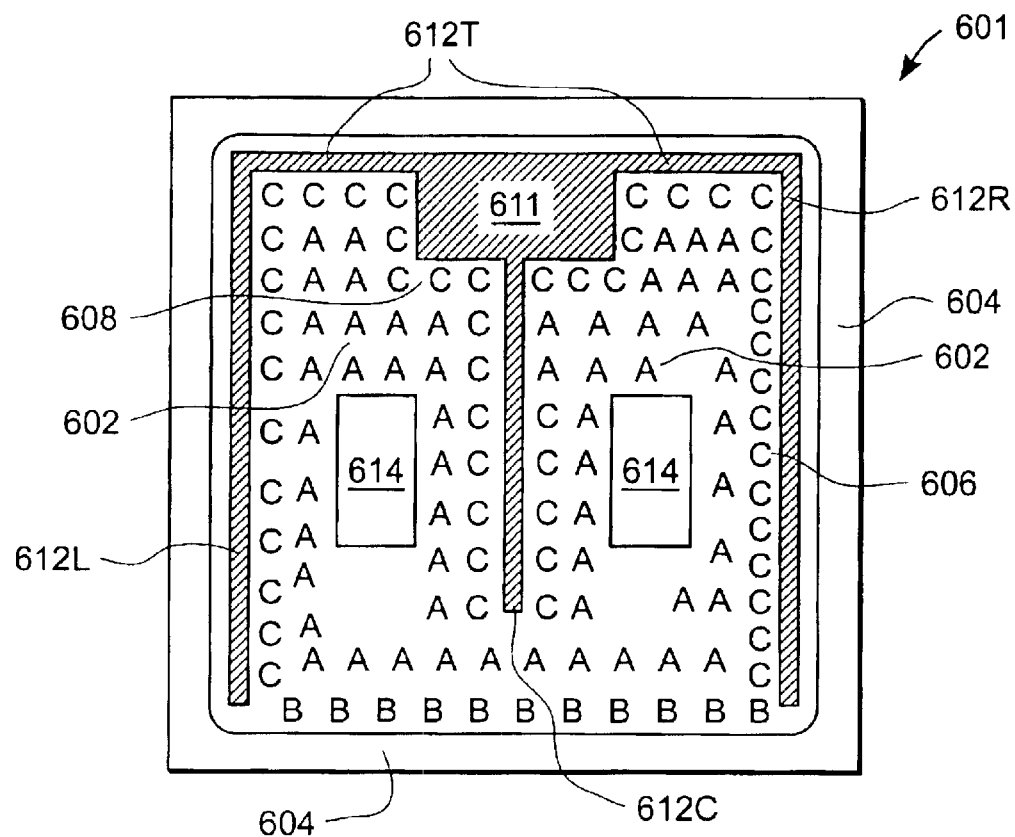
FIG. 6 shows conventional prior art power devices.
Figure 6B:
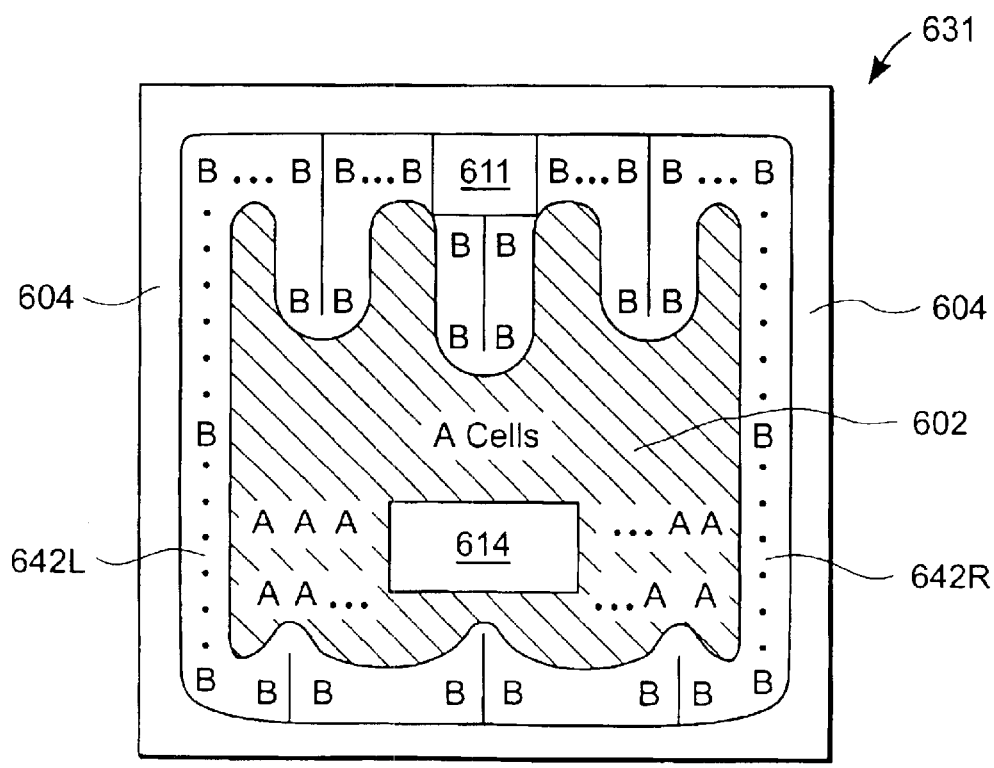

For purposes of discussion, to distinguish the A cells which are the workhorses of the power device and the B and C cells, the A cells are referred to as the active cells, while the B and C cells are collectively referred to as the peripheral cells. Similarly, the active area 602 (also "active device area"), shown in FIGS. 6A and 6B for example, is distinguished from the other regions (collectively referred to as ancillary regions) such as the guard ring region 604 which typically contains no cells and termination areas 642L, 642R which comprise termination cells. The active area is that area of the device which provides the transistor action, whereas the ancillary regions include structures such as gate vias for distributing the gate current over the area of polysilicon and the guard ring region used around the edge of the die to prevent peripheral voltage breakdown.

Figure 1:
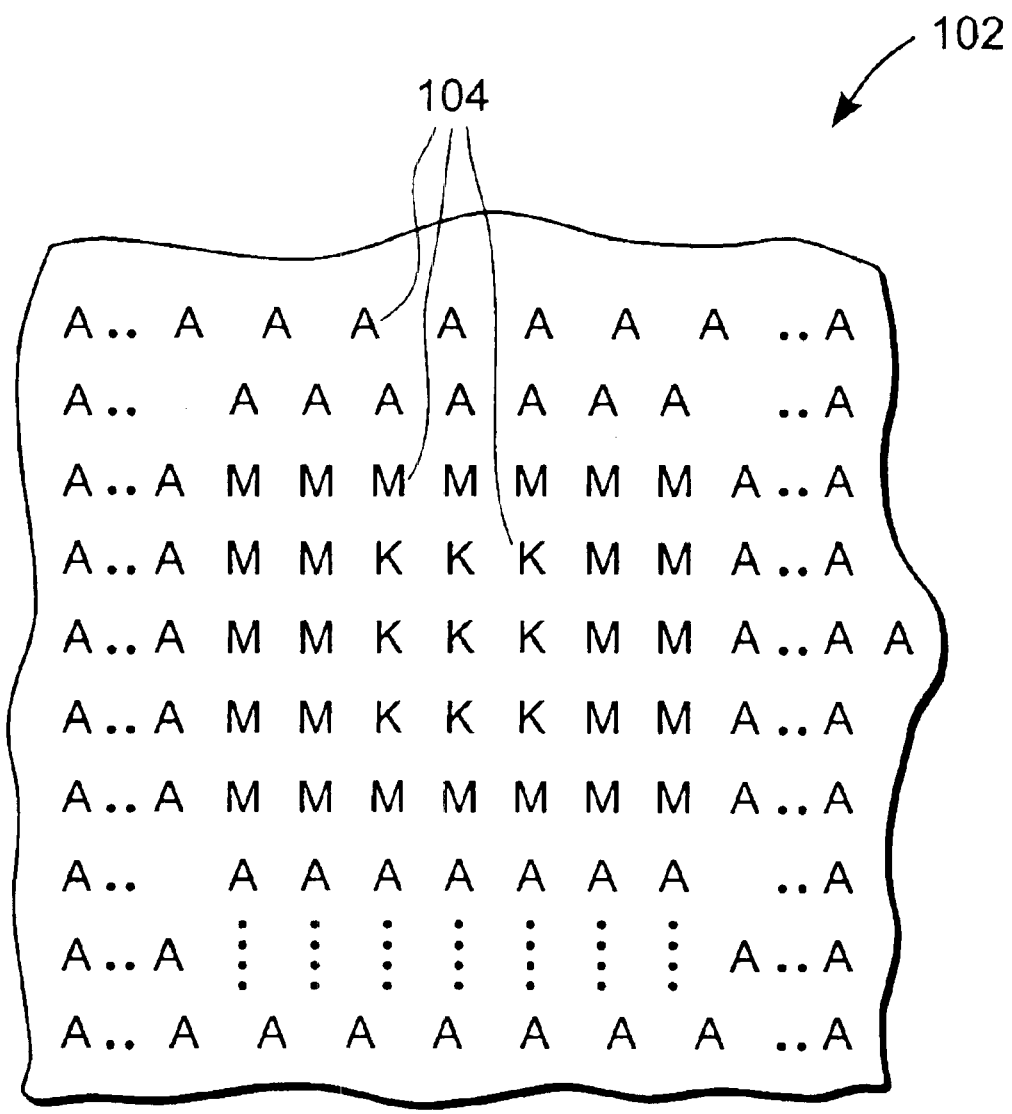
FIG. 1 illustrates an example of an active area of a power device in accordance with an embodiment of the invention.

Referring to FIG. 1, the invention provides an active area of a power device in which the constituent active cells have design parameters that vary depending on where they are located in the active area. FIG. 1 shows an illustrative example of an active area 102 of a semiconductor power device, such as the active areas 602 in FIGS. 6A and 6B. The active area comprises active cells 104 identified by the letters A, M, and K. In accordance with the present invention, the structure of the A active cells is different from those of the M and K active cells. Similarly, the structure of the M active cells is different from those of the A and K active cells. The design parameters of each active cell, such as physical dimensions (e.g., die area of the cell), materials, doping levels, and the like, vary based on the location within the active area that the structure is located.

For example, the thermal behavior may dictate the particular structure and general makeup of the active cells 104 within the active area 102 based on their location within the active area. In particular, the cell structure is varied in such a way as to reduce the temperature rise during operation of the inventive power device. Thus, as can be seen in FIG. 1, the K active cells have a design that is suitable for their being located in an innermost portion of the active area. The M active cells have a design different from the K active cells that is suitable for their location around the periphery of the innermost portion. The A active cells are likewise designed for use in the outer periphery of the active area.

As alluded to above, the cell design can be varied in a number of ways. For example, different cell sizes can be used. The internal structure of each cell can be tailored depending on its location within the active area. The materials and doping levels can be varied. The physical and electrical operating characteristics of transistor devices are well known and understood. Consequently, these and other ways to design cells in a power device to have specific operating characteristics fall within the scope of knowledge of ordinary practitioners in the relevant semiconductor arts.

Cells have either a "closed" form structure or an "open" form structure. These forms are well known in the art. Basically, a closed cell structure is one in which its gate region totally encircles its body region. Typical closed cell geometries include square-shaped cells and hexagonal cells. Open cells have a stripe geometry. Such cells comprise alternating stripes of gate material (e.g., polycrystalline silicon) and "body" material (e.g., a doped epitaxial layer).

In accordance with the invention, the most general case would call for each active cell having a unique design that is a function of its intended location in the active area 102 of the power device, so that no two active cells in the active area are the same. Such an approach, however, quickly reaches the limit of diminishing return, incurring manufacturing costs which far outweigh any gains in device operation. A more practical approach is to identify portions in the active area and select a design for the cells in each portion. This way, a smaller number of cell designs need to be produced.

Though FIG. 1 indicates three different cell designs, namely the A cells, the M cells, and the K cells, it is understood that more or fewer cell designs may be needed, depending on the size of the power device, the anticipated operating range of the power device, perhaps even cost and manufacturing considerations, and so on. FIG. 1 also shows a particular configuration of the three portions. The K cell portion is rectangular in shape and is surrounded by a portion of the active area defined by a band of M cells. The M cell portion in turn is surrounded by the A cells.

FIG. 1 merely depicts an illustrative example of the myriad possible configurations that are available to the power device designer. The cells can be arranged in any of a number of patterns. A first portion may be surrounded by a second portion, such as shown in FIG. 1. Alternatively, the first portion my be disposed adjacent a second portion. Each cell can be of any of a number of shapes, e.g., square, triangle, hexagonal, etc. The present invention does not limit the arrangement of active cells in the active area to any one particular configuration or any particular number of cell designs. The present invention teaches that by varying the design of the active cells in the active area, it is possible to avoid the problems resulting from the non-uniform distribution of physical and electrical characteristics observed during operation of conventional semiconductor power device dies. The particular configuration will depend on performance requirements and perhaps cost-related issues and production issues.

The present invention is advantageous in that one can build a device having a more uniform operating temperature distribution across the die surface. The improved operating characteristics include better SOA, increased switching speed, increased switching efficiency, lower resistance, increased device reliability, and improved power-sensitive and temperature-sensitive data sheet parameters.

The following discussion of illustrative example embodiments will be based on closed cell structures. Those trained in the field, however, should realize that the disclosed invention is readily applicable to any type of cell design, whether the cells are closed cell structures or open cell structures. The following examples are illustrative only, showing how cell designs and cell arrangements can be varied depending on the location in the active area of the power device.

Refer back to FIG. 1. To attain more reliable device performance and overall improved performance, an aspect of the invention provides that the current density of the active cells 104 comprising the active area 102 of a power device (not shown) be varied. The current density metric J is defined as $J=A/mm^2$, where A is the current conduction in amps, and $mm^2$ is the area in square millimeters through which the current flows. According to an aspect of the invention, the operational current density of active cells is reduced as one moves from the outer periphery of the active area toward a central portion of the active area. Thus, the active cells located in the central portion, which tends to be the hottest region of the active area, produces less current density under the same biasing condition than the active cells located further away from the central portion.

One method of reducing current density is to modify the cell density per unit area in the portions of the active area 102 for which reduced current density is desired. Thus, for example, in FIG. 1 the K cell portion constitutes the central portion. The K cells can be designed to have cell sizes that are larger than either the M cells or the A cells. In a particular example, the K cells might be $30\mu \times 30\mu$, the M cells might be $25\mu \times 25\mu$, and the A cells might be $20\mu \times 20\mu$. Consequently, the cell density of cells in the K cell portion is lower than cells in the M cell portions, since the K cells are larger and so there are fewer K cells per unit area. Similarly, the M cell portion has a lower cell density than the A cell portion. This has a desirous effect wherein the current density in the K cell portion is lower than in the M cell portion. Similarly, the current density in the M cell portion is lower than the current density in the A cell portion.

According to another aspect of the invention, another way to achieve a difference in current density is to vary the internal current density of each cell 104 itself, in a manner that is a function of where the cell is located in the active area 102. Varying the current density in a transistor is readily achieved by any of numerous known and well understood processing techniques and design parameters, or combinations of process and design. For example, one can provide design K cells that have a gain or transconductance that is different from the gain or transconductance of the M cells and the A cells. Another technique is to use varying source resistances ($R_s$) for the different cells. These and other techniques are known and can be readily adapted to practice the invention.

Figure 2:
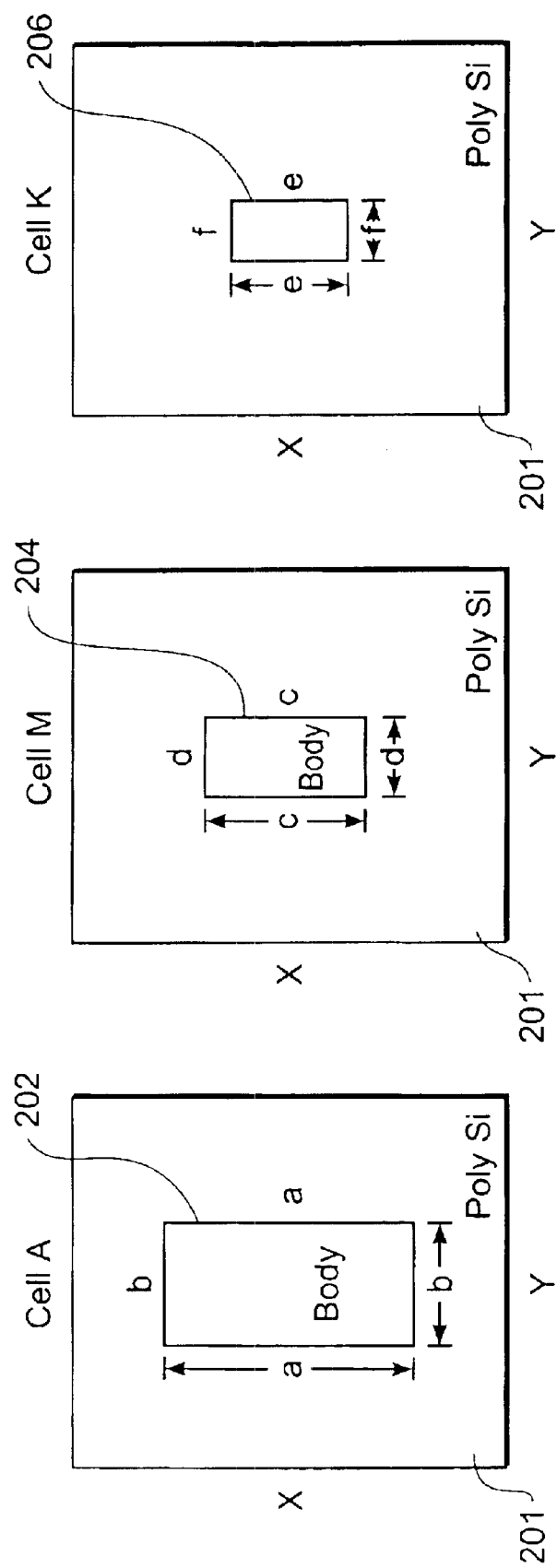
FIG. 2 shows varying cell structures in accordance with an embodiment of the invention.

FIG. 2 shows, in yet another aspect of the invention, three cell designs for the active cells 104 disposed in the active area 102 of FIG. 1. In the example shown in FIG. 2, the A, M, and K cells are the same "size"; i.e., each cell consumes substantially the same amount of area on the die, to within process tolerances since slight dimensional variations from cell to cell will arise. Having same-sized cells is desirable in some case because it simplifies the die layout geometry. However, according to the invention, the cells differ in one or more of their operational characteristics by producing differences each cell's internal construction. For example, one operational characteristic is conductivity. In FIG. 2, it will be seen that the conductivity for the K cells differs from that of the M cells and the A cells. Also, the conductivity of the M cells differs from that of the A cells.

The conductivity is defined by the width of its channel. The width of a channel in turn is defined by the periphery of the opening in the polysilicon layer in the polysilicon gate MOSFET structure. Thus, in FIG. 2, though the A, M, and K cells each have the same overall die area, the openings 202, 204, 206 in the polysilicon layer of each of the cell types is different. For example the channel width W of the A cell is W=(2$a$+2$b$), the channel width for the M cell is W=(2$c$+2$d$), and the channel width for the K cell is W=(2$e$+2$f$).

These are the openings 202, 204, 206 through which the p-well is formed, e.g., by implantation of a p-type dopant and diffusion. The polysilicon material 201 surrounding the openings act as masks for the implant step, with a subsequent step of the source implant, in this case the n+ source for an n-channel MOSFET. The channel width of the K cell is the smallest, since it has the smallest area of opening in the polysilicon material 201. Consequently, the K cells will conduct the least current of the three cells. An advantage of this approach to the invention is that the performance of the cells is determined by their geometry and not by differences in doping levels in each cell. Other similar techniques are known for varying the channel width, such as masking out the n+ source doping in selected areas, and so on. Such methods are known by persons of ordinary skill in the relevant arts.

Figure 3:
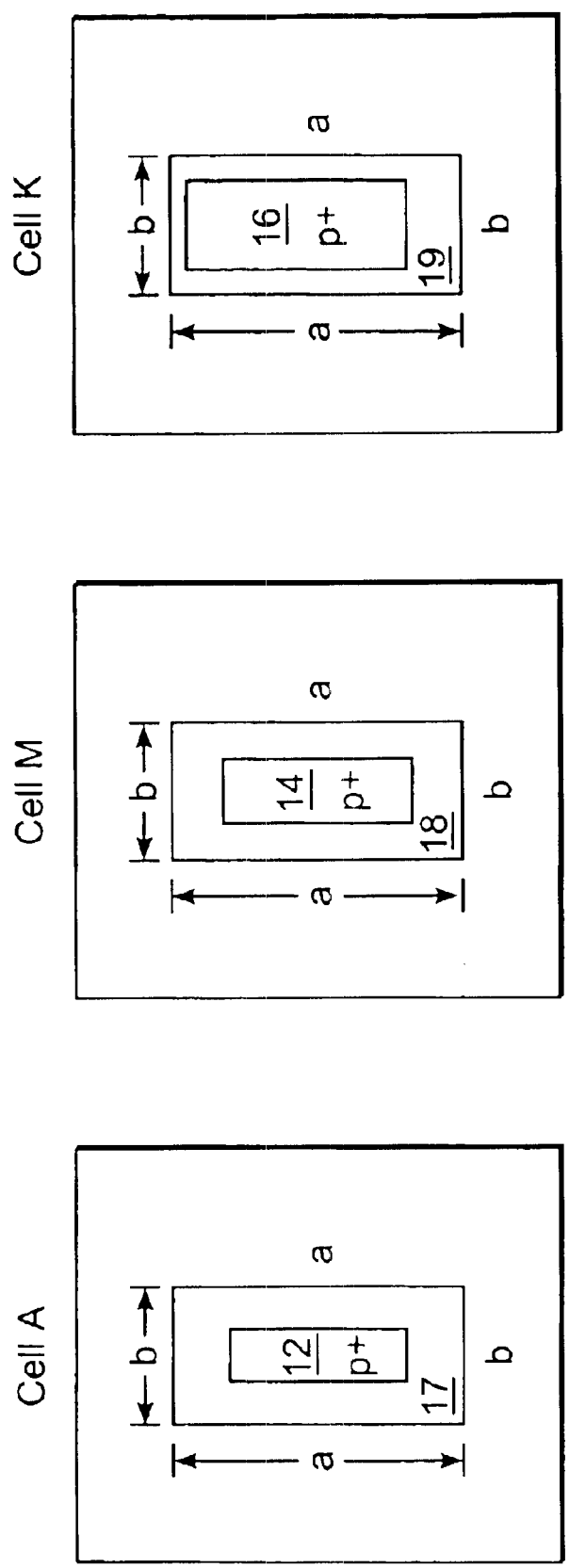
FIG. 3 shows varying cell structure in accordance with another embodiment of the invention.

FIG. 3 shows an illustrative example of yet another embodiment of the invention. Here, the threshold voltage of the A cells, the M cells, and the K cells are varied. As in FIG. 2, the cells are the same size, however, the current density can be controlled by varying the threshold voltage of the cells. Thus, the threshold voltage $V_{thA}$ of the A cells is lower than $V_{thM}$ of the M cells, which is lower than $V_{thK}$ of the K cells. Thus for a given applied gate voltage, the current produced by the three cell groups will be different. The A cells will conduct the most current since their threshold voltages are the lowest, while the K cells will conduct the least current. This is precisely the current density arrangement that is desired, since the central portion tends to be the hottest region of the active area.

Achieving a desired threshold voltage is a very well understood process, accomplished by varying the material composition of the transistor. For example, one can vary the p-well doping level in an n-channel FET. Each cell would receive a doping level depending on its location in the active area (102, FIG. 1). As can be seen in FIG. 3, the opening 12 of the A cells is smaller than the opening 14 of the M cells, which in turn is smaller than the opening 16 of the K cells. The opening refers to the mask pattern that defines the window through which the $p^+$ is deposited. By varying the size of the window (i.e., it's opening), one can vary the amount of $p^+$ that is implanted in the cell, and its proximity to the MOS channel area: e.g. areas 17, 18, and 19 in FIG. 3. This then produces variation in the threshold voltage, Vt, of this particular MOS transistor or IGBT cell. The bigger the window and the closer its edge is to the edge of the poly-silicon, the higher the Vt. The poly-silicon edge in the cells in FIG. 3 are the ones that define the opening, or the window b×a. By varying the area of the opening through which $p^+$ doping will occur during a standard $p^+$ doping step, cells having different voltage thresholds can be fabricated. This has the further benefit of avoiding an extra masking step in the process, sometimes used in conventional MOS processing, where Vt adjustments are desired. The adjustment is accomplished by an extra masking step called a 'Vt adjustment mask', which may also be followed by a short diffusion step just for that purpose. In this step after the regular p-well doping deposition (or ion implant) is done, there is an extra mask to define the cells that need a higher Vt, and they get extra p-doping (say by ion implant). Thus the extra mask has only designated windows for the additional implant in these cells.

To further enhance the beneficial thermal effects of the present invention, some of the cells in the active area can be fabricated with only the p-well, with no n+ source at all. Thus, the active area would contain active cells having design parameters dependent on location within the active area as well as cells comprising only a p-well. This approach might be taken for some of the hottest areas of the die, where the temperature rise during operation can create a hot spot. This aspect of the invention is particularly effective for designing active area of IGBT'S.

Figure 4:
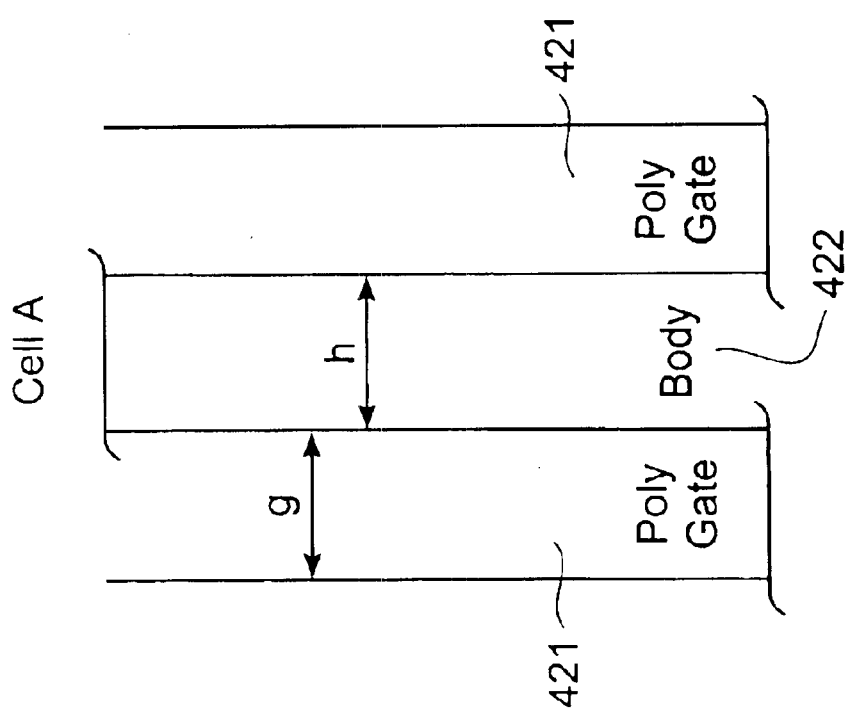

Referring to FIG. 4, the present invention is readily adapted for striped geometry cells. FIG. 4 shows an A cell designed with a stripe geometry. The cell is comprised of stripes of gates 421 (usually a polysilicon material), arranged in alternating fashion with stripes of "body" 422 (e.g., p-well and source). Conventionally, the structure comprising a gate stripe 421 and a body stripe 422 constitutes a cell. The two-stripe structure is repeated across a portion of the die to produce the active area of the power device. The gate stripes 421 have a width "g", while the body stripe 422 has a width "h".

Figure 5:
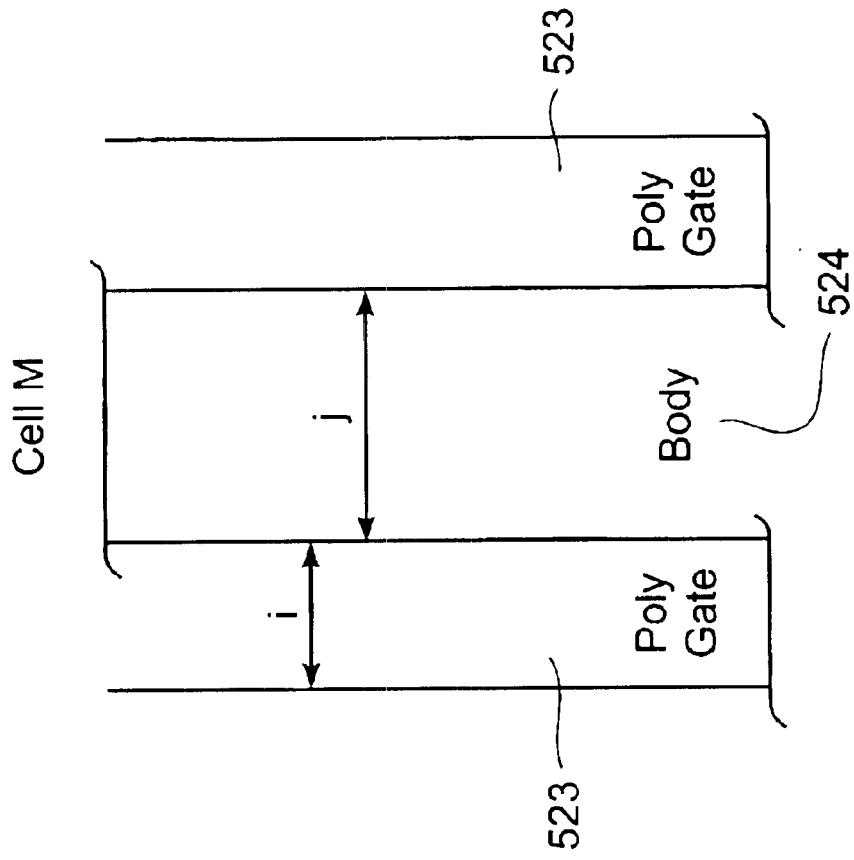
FIGS. 4 and 5 show cell structures having a stripe geometry.

FIGS. 4 and 5 illustrate another embodiment of the present invention. The cell structure can be varied by varying the pitch of the stripes depending on their location in the active area. For example, FIG. 5 shows an M cell having a gate stripe 523 whose width is "i" and a body stripe 524 whose width is "j", where "i" and "j" may be different from the "g" and "h" dimensions (FIG. 4), respectively. The result is that the current density in the A and M cells will differ by virtue of the differences in the stripe dimensions.

Alternatively, the cell internal characteristics such as voltage threshold can be varied while maintaining unchanged the stripe dimensions, in order to vary current density. Still another alternative is to vary both the stripe dimensions and the internal characteristics to achieved a desired current density.

The foregoing has been a presentation of illustrative examples of different embodiments of the invention. A person of ordinary skill will readily understand that numerous semiconductor processing techniques are available to fabricate the active cells comprising a power semiconductor device in accordance with the invention. The examples are not intended to limit the scope of the invention, but rather to teach how one can practice the invention disclosed herein using any of a myriad of semiconductor fabrication techniques too numerous to be covered, but are otherwise well within the skill and scope of knowledge of the ordinary practitioner in the relevant arts.

Furthermore, though the active cells discussed have been described in the context of cells (i.e., transistors) used in power device applications, the active cells can be configured for use in other semiconductor devices which utilize arrays of repeated cell structures. Notably, semiconductor memory devices constructed in accordance with the invention may benefit from the improved physical and electrical operating behavior realized by the invention.

In the context of a semiconductor memory device, the active area would comprise an array or arrays of memory cells. The array(s) is surrounded by ancillary circuitry, which may include sense amplifiers in the case of static RAM, address decoding logic, refresh logic in the case of DRAMs, and so on. It is within the knowledge of those skilled in the art to apply the teachings of the present invention to the design of memory devices in order to realize the benefits of the invention.'

Accordingly, the invention is not limited to the foregoing illustrative examples of the various described embodiments. Various modifications can be made without departing from the technical ideas of the invention.

What is claimed is:

1. A power semiconductor device comprising:
   a substrate;
   an active area defined on said substrate, said active area having a first portion, a second portion, and a third portion;
   terminating cells disposed about a portion of a periphery of said active area;
   a plurality of first active cells disposed in said first portion; and
   a plurality of second active cells disposed in said second portion,
   said third portion comprising third active cells different from said first active cells and said second active cells,
   said first active cells having at least one design parameter different from that of said second active cells, said design parameter being determined based on where said first portion is located in said active area.

2. The device of claim 1 wherein said first active cells collectively produce a current density different from the current density collectively produced by said second active cells.

3. The device of claim 1 wherein each of said first active cells each is characterized by a first cell current density, said second active cells each is characterized by a second cell current density, said first cell current density is different from said second cell current density.

4. The device of claim 1 wherein said design parameter is source resistance.

5. The device of claim 1 wherein said design parameter is transconductance.

6. The device of claim 1, wherein a physical dimension of said first active cells is different from that of said second active cells.

7. The device of claim 1 wherein said first active cells each has an associated first channel dimension, said second active cells each has an associated second channel dimension different from said first channel dimension.

8. The device of claim 1 wherein said first active cells and said second active cells are metal oxide field effect transistors.

9. The device of claim 1 wherein said first portion generally further from a periphery of said active area than said second portion, wherein said design parameter of said first active cells is such that a current density of said first portion is less than a current density of said second portion.

10. A semiconductor device comprising:
    a semiconductor die having an active region defined thereon;
    a first region defined in said active region and comprising first active cells;
    a second region defined in said active region and comprising second active cells; and
    a third region defined in said active region and comprising third active cells different from said first active cells and said second active cells,
    each of said first active cells having substantially identical physical dimensions and material composition,
    each of said second active cells having substantially identical physical dimensions and material composition,
    said first active cells being different from said second active cells with respect to at least one of said physical dimensions or material composition,
    one of said physical dimensions and material composition of each first active cell being based on a location of said first region in said active region,
    one of said physical dimensions and material composition of each second active cell being based on a location of said second region in said active region,
    wherein said first region is closer to a center of said active region than said second region and said third region, and said second region is closer to said center of said active region than said third region.

11. The device of claim 10 wherein each of said active cells has a design parameter, said design parameter of said first active cells being different from said design parameter of said second active cells.

12. The device of claim 11 wherein said design parameter is current density.

13. The device of claim 11 wherein said design parameter is source resistance.

14. The device of claim 11 wherein said design parameter is transconductance.

15. The device of claim 10 wherein during operation of said device a current density in said first region is different from a current density in said second region.

16. The device of claim 10 wherein said first active cells and said second active cells are metal oxide field effect transistors.

17. The device of claim 10 wherein said first region is closer to a center of said active region than said second region, wherein said physical dimensions or material composition of each of said first active cells and said second active cells are such that a current density in said first region is less than a current density in said second region.

18. The device of claim 10 wherein said second active cells are closer to a periphery of said active region than said first active cells, wherein said physical dimensions or material composition of each first active cell and of each second active cell are such that a current density in said first region is less than a current density in said second region.

19. The device of claim 1 wherein said first active cells differ from said second active cells with respect to their respective channel dimensions.

20. The device of claim 1 wherein said first active cells differ from said second active cells with respect to one or more of their respective doping levels.

21. The device of claim 1 wherein said first region is surrounded by said second region.

22. The device of claim 1 wherein said material composition of said first active cells and said second active cells vary depending on their location in said active region.

23. The device of claim 6 wherein said first active cells and said second active cells each consuming substantially the same amount of area on said semiconductor die.

24. The device of claim 1 wherein the amount of area of said semiconductor die consumed by each of said first active cells and by each of said second active cells varies depending on their location in said active region.

25. The device of claim 1 wherein a cell density of said first region is different from a cell density of said second region.

26. The device of claim 11 wherein said design parameter is transistor gain.

27. The device of claim 11 wherein said design parameter is threshold voltage.

28. The device of claim 1 wherein said first active cells and said second active cells are memory cells.

29. The device of claim 1 wherein said first portion is encircled by said second portion.

30. The device of claim 1 wherein said first portion encompasses the center of said active area.

31. The device of claim 1 wherein said design parameter is transistor gain.

32. The device of claim 1 wherein said design parameter is threshold voltage.

33. The device of claim 1 wherein said spacing among said first active cells is different from a spacing among said second active cells.

34. The device of claim 1 wherein said physical dimension is a die area required by each of said first active cells and said second active cells.

35. The device of claim 1 wherein said first active cells and said second active cells each have substantially the same physical dimensions, said first active cells each having a material composition different from that of each of said second active cells.

36. The device of claim 1 wherein said first active cells and said second active cells are memory cells.

* * * * *

UNITED STATES PATENT AND TRADEMARK OFFICE
CERTIFICATE OF CORRECTION

| | | |
|---|---|---|
| PATENT NO. | : 6,710,405 B1 | |
| APPLICATION NO. | : 09/764545 | |
| DATED | : March 23, 2004 | |
| INVENTOR(S) | : Zommer et al. | |

It is certified that error appears in the above-identified patent and that said Letters Patent is hereby corrected as shown below:

<u>Title Page:</u>
At Item (75), please delete "Nathan Zommer, Los Altos, CA (US); Vladimir Tsukanov, Mountain View, CA (US)" and insert --Vladimir Tsukanov, Mountain View, CA (US); Nathan Zommer, Los Altos, CA (US)--.

Claim 23, Column 11, Line 16, please delete "consuming" and insert --consume--.

Signed and Sealed this

Eleventh Day of September, 2007

JON W. DUDAS
*Director of the United States Patent and Trademark Office*

UNITED STATES PATENT AND TRADEMARK OFFICE
CERTIFICATE OF CORRECTION

PATENT NO.         : 6,710,405 B1
APPLICATION NO. : 09/764545
DATED              : March 23, 2004
INVENTOR(S)        : Vladimir Tsukanov and Nathan Zommer Page 1 of 1

It is certified that error appears in the above-identified patent and that said Letters Patent is hereby corrected as shown below:

<u>In the Claims</u>:
Claim 19, Column 11, Line 4, please delete "1" and insert --10--.
Claim 20, Column 11, Line 7, please delete "1" and insert --10--.
Claim 21, Column 11, Line 10, please delete "1" and insert --10--.
Claim 22, Column 11, Line 12, please delete "1" and insert --10--.
Claim 24, Column 11, Line 18, please delete "1" and insert --10--.
Claim 25, Column 11, Line 22, please delete "1" and insert --10--.
Claim 28, Column 12, Line 3, please delete "1" and insert --10--.
Claim 30, Column 12, Line 3, please delete "1" and insert --29--.

Signed and Sealed this

Thirtieth Day of October, 2007

JON W. DUDAS
*Director of the United States Patent and Trademark Office*

UNITED STATES PATENT AND TRADEMARK OFFICE
CERTIFICATE OF CORRECTION

PATENT NO. : 6,710,405 B1  Page 1 of 1
APPLICATION NO. : 09/764545
DATED : March 23, 2004
INVENTOR(S) : Vladimir Tsukanov and Nathan Zommer It is certified that error appears in the above-identified patent and that said Letters Patent is hereby corrected as shown below:

In the Claims:

Claim 19, Column 11, Line 4, please delete "1" and insert --10--.

Claim 20, Column 11, Line 7, please delete "1" and insert --10--.

Claim 21, Column 11, Line 10, please delete "1" and insert --10--.

Claim 22, Column 11, Line 12, please delete "1" and insert --10--.

Claim 24, Column 11, Line 18, please delete "1" and insert --10--.

Claim 25, Column 11, Line 22, please delete "1" and insert --10--.

Claim 28, Column 12, Line 3, please delete "1" and insert --10--.

Claim 30, Column 12, Line 3, please delete "1" and insert --29--.

Signed and Sealed this

Twenty-seventh Day of November, 2007

JON W. DUDAS
*Director of the United States Patent and Trademark Office*